(12) United States Patent
Bai et al.

(10) Patent No.: US 10,002,911 B2
(45) Date of Patent: Jun. 19, 2018

(54) DISPLAY BACK PLATE AND FABRICATING METHOD THEREOF AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Juanjuan Bai, Beijing (CN); Haidong Wu, Beijing (CN); Wenyu Ma, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days. days.

(21) Appl. No.: 15/540,217

(22) PCT Filed: Jan. 21, 2016

(86) PCT No.: PCT/CN2016/071600
§ 371 (c)(1),
(2) Date: Jun. 27, 2017

(87) PCT Pub. No.: WO2017/028497
PCT Pub. Date: Feb. 23, 2017

(65) Prior Publication Data
US 2017/0365646 A1    Dec. 21, 2017

(30) Foreign Application Priority Data
Aug. 17, 2015   (CN) .......................... 2015 1 0505813

(51) Int. Cl.
| H01L 27/32 | (2006.01) |
| H01L 51/52 | (2006.01) |
| H01L 51/50 | (2006.01) |

(52) U.S. Cl.
CPC ...... *H01L 27/3211* (2013.01); *H01L 27/3216* (2013.01); *H01L 51/50* (2013.01); *H01L 51/5203* (2013.01)

(58) Field of Classification Search
CPC . H01L 27/3211; H01L 27/3216; H01L 51/50; H01L 51/5203
See application file for complete search history.

(56) References Cited

U.S. PATENT DOCUMENTS

| 8,368,054 B2 | 2/2013 | Kim et al. |
| 8,766,282 B2 | 7/2014 | Noh |

(Continued)

FOREIGN PATENT DOCUMENTS

| CN | 101582440 A | 11/2009 |
| CN | 103915468 A | 7/2014 |

(Continued)

OTHER PUBLICATIONS

PCT (CN) International Search Report, Application No. PCT/CN2016/071600, dated May 23, 2016, 2 pgs.

(Continued)

*Primary Examiner* — Allan R Wilson
(74) *Attorney, Agent, or Firm* — Armstrong Teasdale LLP

(57) ABSTRACT

The present disclosure provides a display back plate and a fabricating method thereof and a display device. The display back plate includes a base layer. A plurality of recesses are formed in the base layer, and a plurality of sub-pixels are formed in the plurality of recesses. The sub-pixel includes a first electrode layer, which is formed in the recess, a light-emitting material layer, which is formed on the first elec- (Continued)

trode layer, and a second electrode layer, which is formed on the light-emitting material layer. Thickness differences exist among a plurality of the light-emitting material layers, and upper surfaces of the plurality of light-emitting material layers are positioned on the same plane.

20 Claims, 2 Drawing Sheets

(56) References Cited

U.S. PATENT DOCUMENTS

| | | | | |
|---|---|---|---|---|
| 8,772,774 | B2* | 7/2014 | Tsai | H01L 27/3211 257/59 |
| 2004/0217697 | A1* | 11/2004 | Lee | H01L 27/3211 313/504 |
| 2007/0228367 | A1* | 10/2007 | Nakamura | H01L 51/5265 257/40 |
| 2010/0052524 | A1 | 3/2010 | Kinoshita | |
| 2012/0211733 | A1* | 8/2012 | Hwang | C09K 11/06 257/40 |
| 2015/0108446 | A1* | 4/2015 | Ando | H01L 51/5265 257/40 |
| 2015/0137082 | A1* | 5/2015 | Kim | H01L 27/3211 257/40 |

FOREIGN PATENT DOCUMENTS

| | | |
|---|---|---|
| CN | 103928624 A | 7/2014 |
| CN | 104362257 A | 2/2015 |
| CN | 204179111 U | 2/2015 |
| CN | 105070739 A | 11/2015 |

OTHER PUBLICATIONS

PCT (CN) Written Opinion, Application No. PCT/CN2016/071600, dated May. 23, 2016, 6 pgs.: with English translation.
China First Office Action including search report, Application No. 201510505813.0, dated XX, 21 pgs.: with English translation.

* cited by examiner

US 10,002,911 B2

DISPLAY BACK PLATE AND FABRICATING METHOD THEREOF AND DISPLAY DEVICE

CROSS REFERENCE TO RELATED APPLICATIONS

This patent application is a National Stage Entry of PCT/CN2016/071600 filed on Jan. 21, 2016, which claims the benefit and priority of Chinese Patent Application No. 201510505813.0 filed on Aug. 17, 2015, the disclosures of which are incorporated herein in their entirety as a part of the present application.

BACKGROUND

The present disclosure relates to the field of display technologies, and more particularly, to a display back plate and a fabricating method thereof and a display device.

To enhance a luminance of an organic light-emitting diode (OLED) element in an OLED display device, one means in the prior art is to form a cathode and an anode of the OLED element into a microcavity structure. Referring to FIG. 1, it is a schematic structural diagram of an OLED of an OLED display device in the prior art, including an anode 300 and a cathode 400, a back plate auxiliary layer 200 configured to bear the anode 300, and a pixel defining layer 500 and an electroluminescent material layer 600 which are formed on the anode 300. A plurality of recesses are formed in the pixel defining layer 500, the electroluminescent material layer 600 is formed in each of the recesses, and the cathode 400 is formed on the electroluminescent material layer 600 and the pixel defining layer 500. Corresponding to locations of sub-pixels with different colors (R/G/B), the thickness of the electroluminescent material layer 600 may be different (the longer the wavelength of light of the color of a sub-pixel is, the thicker the electroluminescent material layer 600 at the sub-pixel is), so that at each sub-pixel, the anode 300 and the cathode 400 may constitute a microcavity structure that can enhance light of the color of the sub-pixel. Referring to FIG. 1, supposing that the colors of the sub-pixels are red (R), green (G), and blue (B), the thickness of the electroluminescent material layer 600 formed at the red sub-pixel R is greater than that of the electroluminescent material layer 600 formed at the green sub-pixel G, and the thickness of the electroluminescent material layer 600 formed at the green sub-pixel G is greater than that of the electroluminescent material layer 600 formed at the blue sub-pixel B. In this way, when cathode materials are deposited on the pixel defining layer 500 and the light-emitting material layer 600 to form the cathode 400, the electroluminescent material layer 600 bearing the cathode materials is different in thickness at different sub-pixels, which may cause the cathode materials to be formed on different planes, thereby reducing the film formation quality of the cathode materials and easily causing fracture of the formed cathode layer.

BRIEF DESCRIPTION

An objective of the present disclosure is to solve the aforementioned technical problems.

The present disclosure provides a display back plate, which includes a base layer. A plurality of recesses are formed in the base layer. A plurality of sub-pixels are formed in the plurality of recesses. The sub-pixel includes a first electrode layer formed in the recess, a light-emitting material layer formed on the first electrode layer, and a second electrode layer formed on the light-emitting material layer, wherein thickness difference exists among a plurality of the light-emitting material layers, and upper surfaces of the plurality of light-emitting material layers are on a same plane.

Further, the base layer includes a back plate auxiliary layer and a pixel defining layer on the back plate auxiliary layer.

Further, at least one of the plurality of sub-pixels is partially formed in the back plate auxiliary layer.

Optionally, the back plate auxiliary layer includes a transistor array and a passivation layer formed on the transistor array.

Optionally, the plurality of sub-pixels include a first sub-pixel having a first light-emitting material layer, a second sub-pixel having a second light-emitting material layer, and a third sub-pixel having a third light-emitting material layer, wherein the first light-emitting material layer is configured to generate a first light having a first wavelength, the second light-emitting material layer is configured to generate a second light having a second wavelength, the third light-emitting material layer is configured to generate a third light having a third wavelength, and wherein the first wavelength is smaller than the second wavelength, and the second wavelength is smaller than the third wavelength, and wherein a thickness of the third light-emitting material layer is greater than that of the second light-emitting material layer, and the thickness of the second light-emitting material layer is greater than that of the first light-emitting material layer.

In an embodiment, the color of the first light is blue, the color of the second light is green, and the color of the third light is red. The thickness of the third light-emitting layer is greater by 20-50 nm than that of the second light-emitting layer, and the thickness of the second light-emitting layer is greater by 20-50 nm than that of the first light-emitting layer.

In a second aspect, the present disclosure provides a display device which includes the display back plate described above.

In a third aspect, the present disclosure provides a method for fabricating a display back plate, which includes forming a base layer, forming a plurality of recesses in the base layer, and forming a plurality of sub-pixels in the plurality of recesses, wherein forming the sub-pixels includes forming a first electrode layer in the recess, forming a light-emitting material layer on the first electrode layer, and forming a second electrode layer on the light-emitting material layer, and wherein a thickness difference exists among a plurality of the light-emitting material layers, and upper surfaces of the plurality of light-emitting material layers are on the same plane.

Further, forming the base layer includes forming a back plate auxiliary layer, and forming a pixel defining layer on the back plate auxiliary layer.

Further, at least one of the plurality of sub-pixels is partially formed in the back plate auxiliary layer.

Optionally, forming the back plate auxiliary layer includes forming a transistor array, and forming a passivation layer on the transistor array.

Optionally, the plurality of sub-pixels include a first sub-pixel having a first light-emitting material layer, a second sub-pixel having a second light-emitting material layer, and a third sub-pixel having a third light-emitting material layer, wherein the first light-emitting layer material layer is configured to generate a first light having a first wavelength, the second light-emitting layer material layer is configured to generate a second light having a second wavelength, the third light-emitting layer material layer is configured to generate a third light having a third wavelength, and wherein the first wavelength is smaller than the second wavelength, and the second wavelength is smaller than the third wavelength, and wherein the thickness of the third light-emitting material layer is greater than that of the second light-emitting material layer, and the thickness of the second light-emitting material layer is greater than that of the first light-emitting material layer.

In an embodiment, the color of the first light is blue, the color of the second light is green, and the color of the third light is red. The thickness of the third light-emitting layer is greater by 20-50 nm than that of the second light-emitting layer, and the thickness of the second light-emitting layer is greater by 20-50 nm than that of the first light-emitting layer.

Optionally, the method further includes forming an organic coating layer on the second electrode layer.

Optionally, a lower surface of at least one of the sub-pixels and an upper surface of the back plate auxiliary layer are on the same plane.

In the present disclosure, a plurality of recesses are formed in the base layer, and a plurality of sub-pixels are formed in the plurality of recesses. A thickness difference exists among a plurality of the light-emitting material layers, and upper surfaces of the plurality of light-emitting material layers are positioned on the same plane. In such a fabrication process, the second electrode layer at each sub-pixel may be formed on the same plane, which can effectively avoid the problem of fracture of the second electrode layer caused by depositing second electrode layer materials on different planes.

DETAILED DESCRIPTION

Figure 1:
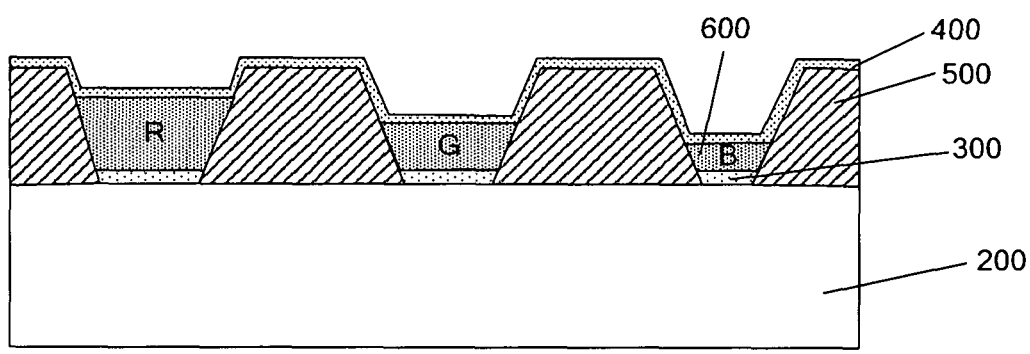
FIG. 1 is a schematic structural diagram of a display back plate in the prior art.

Specific implementation manners of the present disclosure are further described with reference to the accompanying drawings and the embodiments. The following embodiments are merely intended to more clearly describe the technical solutions of the present disclosure, instead of limiting the scope of protection of the present disclosure.

In a first aspect, the present disclosure provides a display back plate, which includes a base layer. A plurality of recesses are formed in the base layer, a plurality of sub-pixels are formed in the plurality of recesses, and the sub-pixel includes a first electrode layer formed in the recess, a light-emitting material layer formed on the first electrode layer, and a second electrode layer formed on the light-emitting material layer.

A thickness difference exists among a plurality of the light-emitting material layers, and upper surfaces of the plurality of light-emitting material layers are positioned on the same plane.

In a second aspect, the present disclosure provides a display device, which includes the display back plate.

In a third aspect, the present disclosure provides a method for fabricating a display back plate, which may be used for fabricating the display back plate as recited in the first aspect. The method includes forming a base layer, forming a plurality of recesses in the base layer, and forming a plurality of sub-pixels in the plurality of recesses, forming the sub-pixels including forming a first electrode layer in the recess, forming a light-emitting material layer on the first electrode layer, and forming a second electrode layer on the light-emitting material layer.

A thickness difference exists among a plurality of the light-emitting material layers, and upper surfaces of the plurality of light-emitting material layers are positioned on the same plane.

According to the display back plate and the fabricating method thereof provided by the present disclosure, a plurality of recesses are formed in the base layer, and a plurality of sub-pixels are formed in the plurality of recesses. A thickness difference exists among a plurality of light-emitting material layers, and upper surfaces of the plurality of light-emitting material layers are positioned on the same plane. In such a fabrication process, the second electrode layer at each sub-pixel may be formed on the same plane, which can effectively avoid a problem of fracture of the second electrode layer caused by depositing second electrode layer materials on different planes.

In the present disclosure, the thicknesses of the light-emitting material layers are not specifically limited, as long as the thicknesses of the plurality of light-emitting material layers can satisfy "a thickness difference exists among a plurality of light-emitting material layers, and upper surfaces of the plurality of light-emitting material layers are positioned on the same plane".

In the present disclosure, a lower surface of at least one of the sub-pixels and an upper surface of the back plate auxiliary layer are positioned on the same plane. In an implementation of this application, a part of the recess positioned under the pixel defining layer (in the back plate auxiliary layer in FIG. 2) is referred to as a "groove", and a height difference between a bottom surface of the recess and the lower surface of the pixel defining layer is referred to as a "depth of the groove". In this application, the minimum depth of the groove may be 0. That is, at a corresponding location, the upper surface of the back plate auxiliary layer may be a roughly flat plane.

During specific implementation, a combination of colors of the sub-pixels may be diverse, and corresponding specific structures may be different. In the following, a brief description is made with reference to the colors of the sub-pixels being red (R), green (G), and blue (B).

In the description of the present disclosure, it is to be noted that the orientations or positions represented by the terms of "up", "down", "top", "bottom" and the like are based on the accompanying figures, they are merely for ease of a description of the present disclosure and a simplified description instead of being intended to indicate or imply the device or element to have a special orientation or to be configured and operated in a special orientation. Thus, they cannot be understood as limiting of the present disclosure.

Figure 2:
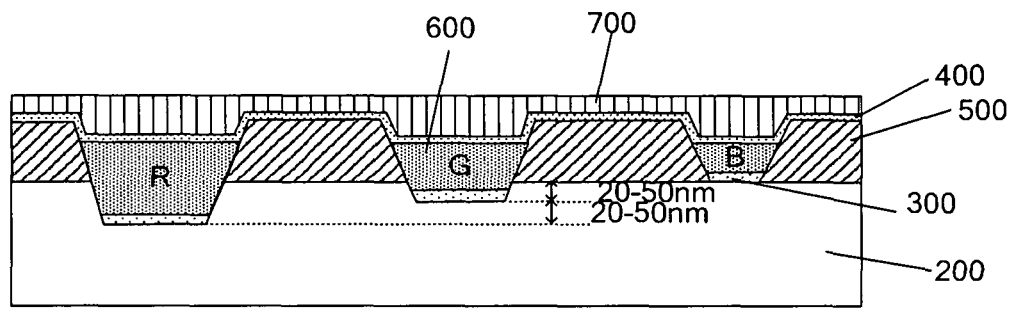
FIG. 2 is a schematic structural diagram of a display back plate according to an embodiment of the present disclosure.

The embodiments of the present disclosure provide a display back plate. As shown in FIG. 2, the display back plate includes a base layer in which a plurality of recesses are formed and a plurality of sub-pixels formed in the recesses. Optionally, the base layer includes a substrate (not shown in the figures), a back plate auxiliary layer 200 formed on the substrate and a pixel defining layer 500 formed on the back plate auxiliary layer 200. The plurality of sub-pixels includes a first electrode layer (including a plurality of independent first electrodes 300) formed in the recess, an electroluminescent material layer 600 formed on the first electrode layer 300, and a second electrode layer 400 formed on the electroluminescent material layer 600. In an implementation, an organic coating layer 700 is disposed on the second electrode layer 400.

Referring to FIG. 2, at locations of the sub-pixels of different colors, the depth of each groove is different. Specifically, the depth of the groove corresponding to a red sub-pixel R is greater by 20-50 nm than that of the groove at a green sub-pixel G, and the depth of the groove at the green sub-pixel G is greater by 20-50 nm than that of the groove at a blue sub-pixel B (in FIG. 2, the depth of the groove corresponding to the blue sub-pixel B is 0, and the upper surface of the back plate auxiliary layer 200 in FIG. 2 is a roughly flat plane at the blue sub-pixel B). Since the depths of the grooves are different, lower surfaces of different recesses (namely, lower surfaces of the grooves) are positioned on different planes. The upper surface of the back plate auxiliary layer 200 herein at the sub-pixels (R, G, and B) of different colors also is positioned on different planes.

Correspondingly, the thickness of the electroluminescent material layer 600 formed at the red sub-pixel R is greater by 20-50 nm than that of the electroluminescent material layer 600 formed at the green sub-pixel G, and the thickness of the electroluminescent material layer 600 formed at the green sub-pixel G is greater by 20-50 nm than that of the electroluminescent material layer 600 formed at the blue sub-pixel B.

In this way, the upper surface of the electroluminescent material layer 600 formed at different sub-pixels is on the same plane, and the second electrode layer 400 formed, on the electroluminescent material layer 600, at sub-pixels with different colors, is on the same plane. The first electrode 300 at each sub-pixel and the second electrode layer 400 positioned above the first electrode 300 constitute a microcavity structure that can enhance light of the color of the sub-pixel.

In the embodiments of the present disclosure, by means of recesses with different depths disposed at sub-pixels with different colors in the back plate auxiliary layer and the pixel forming layer, and in conjunction with the first electrode formed in each recess and a flat second electrode, a microcavity structure that can enhance light of corresponding color is constituted. In this way, not only enhancing outgoing light of different colors can be implemented, but also forming the second electrode layer on the same plane can be implemented, thereby avoiding the problem of fracture of the second electrode layer caused by forming the second electrode layer on different planes.

In the embodiments of the present disclosure, the organic coating layer 700 formed on the second electrode layer 400 is further included, and thus a capability of extraction of light emitted via the second electrode layer 400 can be increased.

Figure 3:
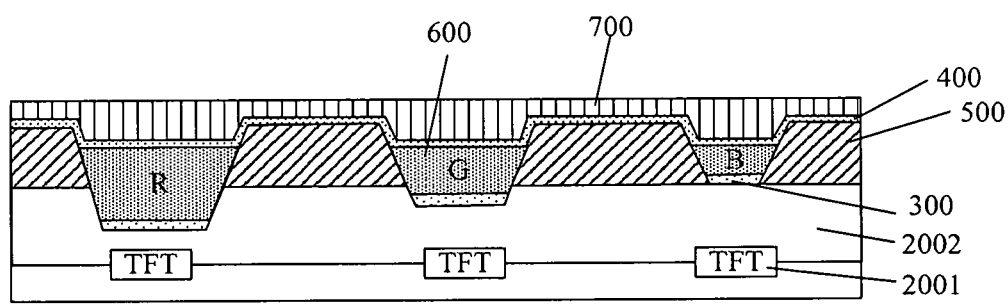
FIG. 3 is a schematic structural diagram of a display back plate according to an embodiment of the present disclosure.

During specific implementation, as shown in FIG. 3, the back plate auxiliary layer 200 herein may include a transistor array 2001 formed on the basement and a passivation layer 2002 formed on the transistor array. The upper surface of the passivation layer 2002 constitutes the upper surface of the whole back plate auxiliary layer 200. In this case, each groove is formed in the passivation layer.

During specific implementation, the electroluminescent material layer 600 may include an electron transport layer (ETL), an electron inject layer (EIL), and other related structures (for example, a color film or a transparent resin may be formed), instead of limiting to a layer structure for implementing electroluminescence.

It is to be readily understood that although in the foregoing embodiments reference is made by taking an example in which colors of the sub-pixels are red, green, and blue (R, G, and B), in practical application, colors of the sub-pixels are not limited to R, G, and B. For example, in practical application, the colors of the sub-pixels may be cyan, magenta, and yellow (C, M, and K), or may be red, green, blue, and white (R, G, B, and W), or may be cyan, magenta, yellow, and black (C, M, Y, and K). Varieties of the colors of the sub-pixels do not affect the scope of protection of the present disclosure, and corresponding technical solutions also fall within the scope of protection of the present disclosure. Likewise, parameters related to the depth difference of the grooves in the back plate auxiliary layer 200 as shown in FIG. 2 are not the unique implementation of the present disclosure.

It is to be readily understood that each of first electrodes 300 are mutually independent (to implement light emission control of different sub-pixels), so that each of the first electrodes is small in area and is not apt to fracture. Therefore, disposing the first electrode layer on the upper surface of the non-flat back plate auxiliary layer 200 does not have a negative effect on corresponding light emission display.

Referring to FIG. 2, during specific implementation, the whole second electrode layer 400 is not needed to be positioned on the same plane. During specific implementation, a segment difference may exist between the second electrode layer 400 on the pixel defining layer 500 and the second electrode layer 400 on the electroluminescent material layer 600.

In an implementation, the back plate auxiliary layer includes a transistor array and a passivation layer. The back plate auxiliary layer in FIG. 2 may be fabricated in the following ways: forming the transistor array on the substrate, forming the passivation layer on the transistor array, forming a pixel defining layer on the passivation layer, etching to form a plurality of recesses, wherein at least one recess is partly formed in the passivation layer, and the lower surface of at least one recess and the upper surface of the passivation layer are on the same plane, forming the first electrode layers and the electroluminescent material layers in the recesses in sequence, wherein the upper surfaces of the plurality of electroluminescent material layers are on the same plane, and forming the second electrode layer on the electroluminescent material layer.

Specifically, optionally the sub-pixels formed in the recesses include a red sub-pixel, a green sub-pixel, and a blue sub-pixel. The groove depth of the red sub-pixel is greater by 20-50 nm than that of the groove depth of the green sub-pixel, the groove depth of the green sub-pixel is greater by 20-50 nm than that of the groove depth of the blue sub-pixel, and the groove depth of the blue sub-pixel is 0.

The upper surfaces of the electroluminescent material layers formed at different sub-pixels are on the same plane. Thus, in view of the wavelengths of red light, blue light, and green light are different, the thickness of the electroluminescent material layer formed at the red sub-pixel is greater by 20-50 nm than that of the electroluminescent material layer formed at the green sub-pixel. Correspondingly, the thickness of the electroluminescent material layer formed at the green sub-pixel is greater by 20-50 nm than that of the electroluminescent material layer formed at the red sub-pixel. Thus, the upper surfaces of the electroluminescent material layers formed at different sub-pixels are basically on the same plane.

In the method for fabricating the display back plate provided by the present disclosure, the second electrode layer is formed on the same plane, which can effectively avoid the problem of fracture of the second electrode layer caused by depositing second electrode layer materials on different planes.

In still another embodiment, the present disclosure provides a display device including the foregoing display back plate. During specific implementation, the display back plate generally includes a color film which may be formed on the display back plate. That is, the display back plate is a color on array (COA) display back plate. Alternatively, the color film may be separately formed in a color film substrate. For the sake of brevity, the concrete structure is not described in detail in the present disclosure.

The display device may be any product or component having a display function, such as an electronic paper display, a mobile phone, a tablet computer, a TV set, a display, a notebook computer, a digital photo frame, a navigation device, and so on.

The above merely are preferred embodiments of the present disclosure. It is to be pointed out that to those of ordinary skill in the art, various improvements and modifications may be made without departing from the technical principles of the present disclosure, and these improvements and modifications are also fall within the scope of protection of the present disclosure.

What is claimed is:

1. A display back plate comprising a base layer, a plurality of recesses formed in the base layer, and a plurality of sub-pixels formed in the plurality of recesses, each sub-pixel comprising:
    a first electrode layer formed in the associated recess;
    a light-emitting material layer formed on the first electrode layer; and
    a second electrode layer formed on the light-emitting material layer, wherein the light-emitting material layer is in physical contact with both the first electrode layer and the second electrode layer, wherein a thickness difference exists among a plurality of the light-emitting material layers, and wherein upper surfaces of the plurality of light-emitting material layers lie in the same plane.

2. The display back plate according to claim 1, wherein the base layer comprises a back plate auxiliary layer and a pixel defining layer on the back plate auxiliary layer.

3. The display back plate according to claim 2, wherein at least one of the plurality of sub-pixels is partially formed in the back plate auxiliary layer.

4. The display back plate according to claim 3, wherein the back plate auxiliary layer comprises a transistor array and a passivation layer formed on the transistor array.

5. The display back plate according to claim 3, wherein the plurality of sub-pixels comprise a first sub-pixel having a first light-emitting material layer, a second sub-pixel having a second light-emitting material layer, and a third sub-pixel having a third light-emitting material layer, wherein:
    the first light-emitting material layer is configured to generate a first light having a first wavelength;
    the second light-emitting material layer is configured to generate a second light having a second wavelength;
    the third light-emitting material layer is configured to generate a third light having a third wavelength;
    the first wavelength is smaller than the second wavelength, and the second wavelength is smaller than the third wavelength; and
    a thickness of the third light-emitting material layer is greater than that of the second light-emitting material layer, and the thickness of the second light-emitting material layer is greater than that of the first light-emitting material layer.

6. The display back plate according to claim 5, wherein the color of the first light is blue, the color of the second light is green, the color of the third light is red, the thickness of the third light-emitting layer is greater by 20-50 nm than that of the second light-emitting layer, and the thickness of the second light-emitting layer is greater by 20-50 nm than that of the first light-emitting layer.

7. The display back plate according to claim 1, further comprising an organic coating layer formed on the second electrode layer.

8. The display back plate according to claim 2, wherein a lower surface of at least one of the sub-pixels and an upper surface of the back plate auxiliary layer lie in the same plane.

9. A display device comprising the display back plate according to claim 1.

10. A display device comprising the display back plate according to claim 2.

11. A display device comprising the display back plate according to claim 3.

12. A display device comprising the display back plate according to claim 4.

13. A method for fabricating a display back plate, comprising:
    forming a base layer;
    forming a plurality of recesses in the base layer; and
    forming a plurality of sub-pixels in the plurality of recesses, wherein forming each of the plurality of sub-pixels comprises:
        forming a first electrode layer in the associated recess;
        forming a light-emitting material layer on the first electrode layer, the light-emitting material layer being in physical contact with the first electrode layer; and
        forming a second electrode layer on the light-emitting material layer, the second electrode layer being in physical contact with the light-emitting material layer, wherein a thickness difference exists among a plurality of the light-emitting material layers, and wherein upper surfaces of the plurality of light-emitting material layers lie in the same plane.

14. The method according to claim 13, wherein forming the base layer comprises:
    forming a back plate auxiliary layer; and
    forming a pixel defining layer on the back plate auxiliary layer.

15. The method according to claim 14, wherein at least one of the plurality of sub-pixels is partially formed in the back plate auxiliary layer.

16. The method according to claim 14, wherein forming the back plate auxiliary layer comprises:
    forming a transistor array; and
    forming a passivation layer on the transistor array.

17. The method according to claim 14, wherein the plurality of sub-pixels include a first sub-pixel having a first light-emitting material layer, a second sub-pixel having a second light-emitting material layer, and a third sub-pixel having a third light-emitting material layer, wherein:
    the first light-emitting material layer is configured to generate a first light having a first wavelength;
    the second light-emitting material layer is configured to generate a second light having a second wavelength;
    the third light-emitting material layer is configured to generate a third light having a third wavelength;

the first wavelength is smaller than the second wavelength, and the second wavelength is smaller than the third wavelength; and a thickness of the third light-emitting material layer is greater than that of the second light-emitting material layer, and the thickness of the second light-emitting material layer is greater than that of the first light-emitting material layer.

18. The method according to claim 17, wherein the color of the first light is blue, the color of the second light is green, the color of the third light is red, the thickness of the third light-emitting layer is greater by 20-50 nm than that of the second light-emitting layer, and the thickness of the second light-emitting layer is greater by 20-50 nm than that of the first light-emitting layer.

19. The method according to claim 13, further comprising forming an organic coating layer on the second electrode layer.

20. The method according to claim 14, wherein a lower surface of at least one of the sub-pixels and an upper surface of the back plate auxiliary layer lie in the same plane.

* * * * *